United States Patent
Huang et al.

(10) Patent No.: US 7,514,920 B2
(45) Date of Patent: Apr. 7, 2009

(54) POSITIONING STRUCTURE OF A MAGNETIC INDUCTION RULER

(75) Inventors: Ming-Chih Huang, Taichung (TW); Chih-Mao Shiao, Taichung (TW)

(73) Assignee: Hiwin Mikrosystem Corp., Taichung (TW)

( * ) Notice: Subject to any disclaimer, the term of this patent is extended or adjusted under 35 U.S.C. 154(b) by 152 days.

(21) Appl. No.: 11/627,948

(22) Filed: Jan. 26, 2007

(65) Prior Publication Data

US 2008/0178485 A1   Jul. 31, 2008

(51) Int. Cl.
*G01B 7/00* (2006.01)
*G01R 33/00* (2006.01)

(52) U.S. Cl. ........................ 324/261; 174/377

(58) Field of Classification Search ............ 324/207.15, 324/261; 174/350, 353, 363, 366, 377–378; 307/89, 91

See application file for complete search history.

(56) References Cited

U.S. PATENT DOCUMENTS

2008/0190660 A1 * 8/2008 Huang et al. ................ 174/377

FOREIGN PATENT DOCUMENTS

JP    07156080 A  *  6/1995
JP    08300884 A  * 11/1996

* cited by examiner

*Primary Examiner*—Bot LeDynh
(74) *Attorney, Agent, or Firm*—Banger Shia

(57) ABSTRACT

A positioning structure of a magnetic induction ruler comprises a base, an induction ruler and a fixing assembly. In one end of the base is formed a first positioning portion, one end of the fixing assembly is formed with a second positioning portion, and the other end of the fixing assembly is formed with a restriction portion. The positioning member of the second positioning portion of the fixing assembly is inserted in the positioning hole of the first positioning portion, enabling both ends of the induction ruler to be fixed to the base by the pressure of the restriction portion of the fixing assembly. Thereby, the magnetic member and the metal members of the induction ruler can be stuck to each other firmly.

6 Claims, 4 Drawing Sheets

POSITIONING STRUCTURE OF A MAGNETIC INDUCTION RULER

BACKGROUND OF THE INVENTION

1. Field of the Invention

The present invention relates to a positioning structure of a magnetic induction ruler, and more particularly to a positioning structure of a magnetic induction ruler, wherein a magnetic member and two metal members can be stuck to each other firmly.

2. Description of the Prior Art

Referring to FIG. 1, a conventional magnetic ruler 10 comprises a magnetic member 11, two metal members 12 and two adhesive members 13. The magnetic member 11 and the metal members 12 are rectangular sheet-shaped, and the magnetic member 11 is thicker than the metal members 12. The adhesive members 13 are double side adhesive, and the metal members 12 are stuck to the opposite sides of the magnetic member 11 by the adhesive members 13 respectively, however, the conventional magnetic ruler 10 has the following disadvantages:

The magnetic ruler 10 is usually disposed on a platform of a processing machine (not shown), and the processing machine will cause chips and greasy dirt during operation. As a result, after a long period of use, the adhesive force of the adhesive members 13 will disappear. Thereby, the magnetic member 11 and the metal members 12, or the magnetic ruler 10 and the platform can not be stuck to each other firmly, and the condition of both ends of the magnetic ruler 10 is worse, even the magnetic induction of the magnetic ruler 10 will be blocked.

The present invention has arisen to mitigate and/or obviate the afore-described disadvantages.

SUMMARY OF THE INVENTION

The primary objective of the present invention is to provide a positioning structure of a magnetic induction ruler, both ends of the induction ruler are fixed to a base, thus ensuring two metal members and a magnetic member of the magnetic ruler are stuck to each other firmly.

A positioning structure of a magnetic induction ruler of the present invention comprises a base, an induction ruler and a fixing assembly. In one end of the base is formed a first positioning portion, one end of the fixing assembly is formed with a second positioning portion, and the other end of the fixing assembly is formed with a restriction portion. The positioning member of the second positioning portion of the fixing assembly is inserted in the positioning hole of the first positioning portion, enabling both ends of the induction ruler to be fixed to the base by the pressure of the restriction portion of the fixing assembly. Thereby, the magnetic member and the metal members of the induction ruler can be stuck to each other firmly, so as to maintain the magnetic induction of the induction ruler.

The present invention will become more obvious from the following description when taken in connection with the accompanying drawings, which show, for purpose of illustrations only, the preferred embodiments in accordance with the present invention.

DETAILED DESCRIPTION OF THE PREFERRED EMBODIMENTS

Figure 1:
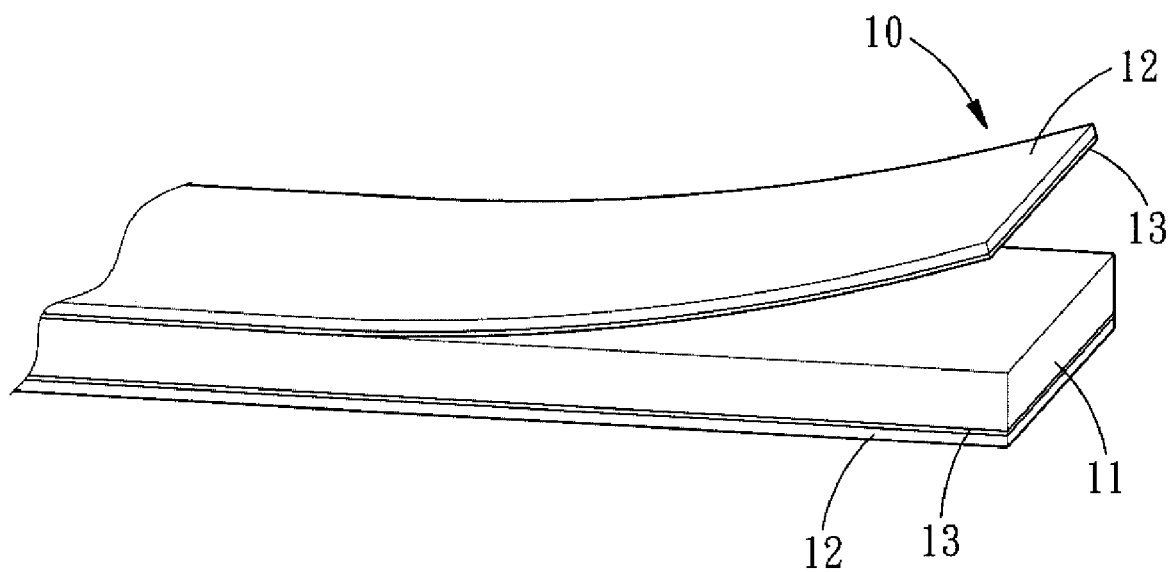
FIG. 1 is a perspective view of a conventional magnetic ruler.
Figure 2:
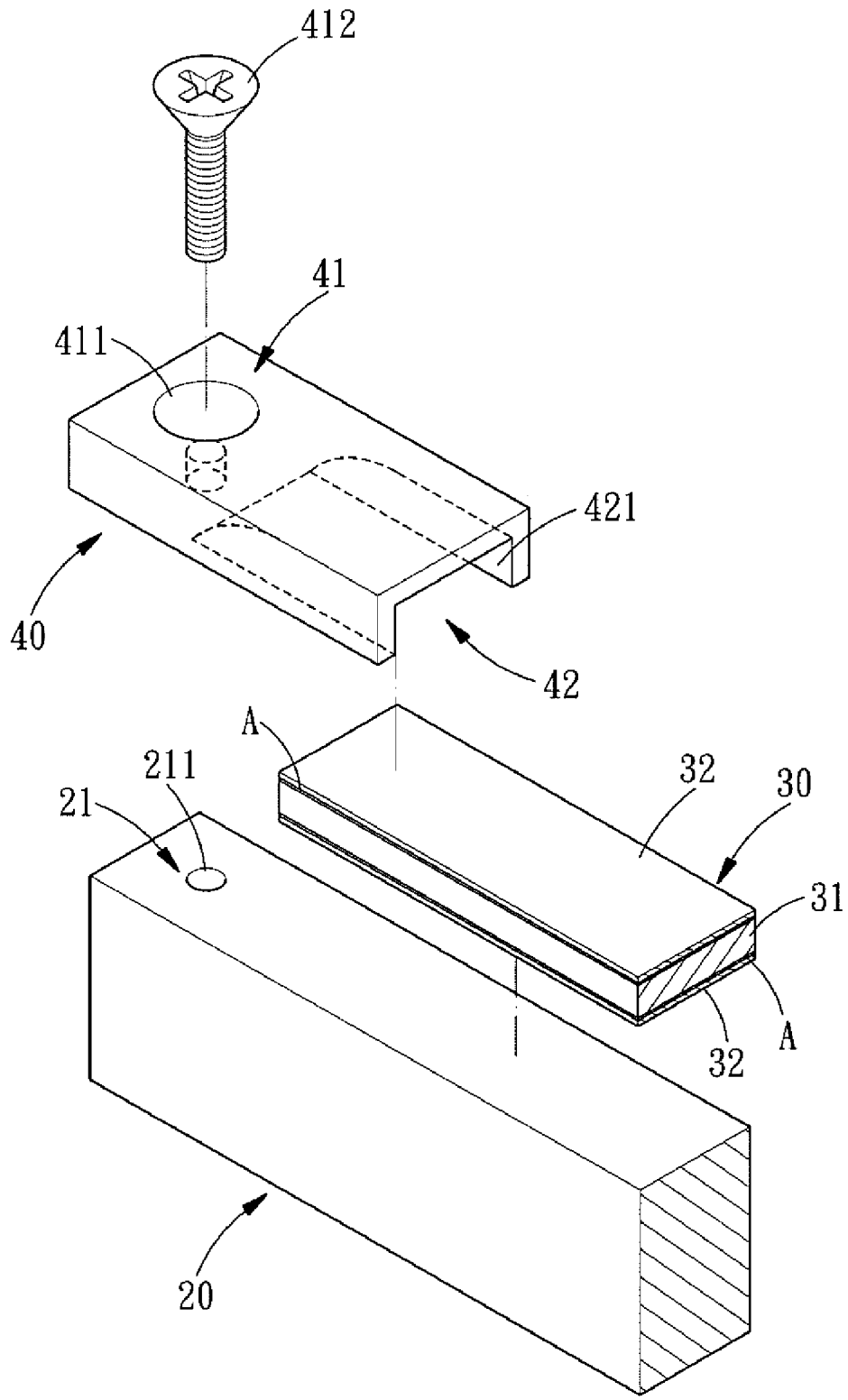
FIG. 2 is an exploded view of a positioning structure of a magnetic induction ruler in accordance with a first embodiment of the present invention.
Figure 3:
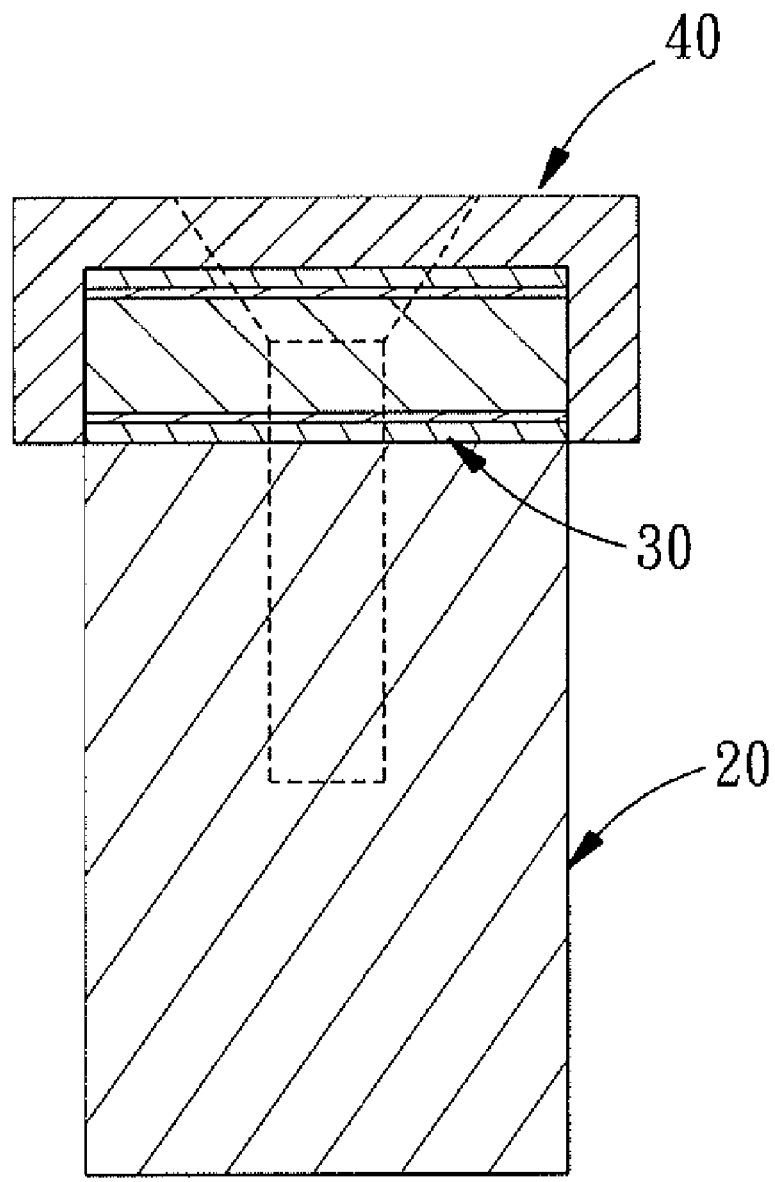
FIG. 3 is a cross sectional view of the positioning structure of a magnetic induction ruler in accordance with the present invention.
Figure 4:
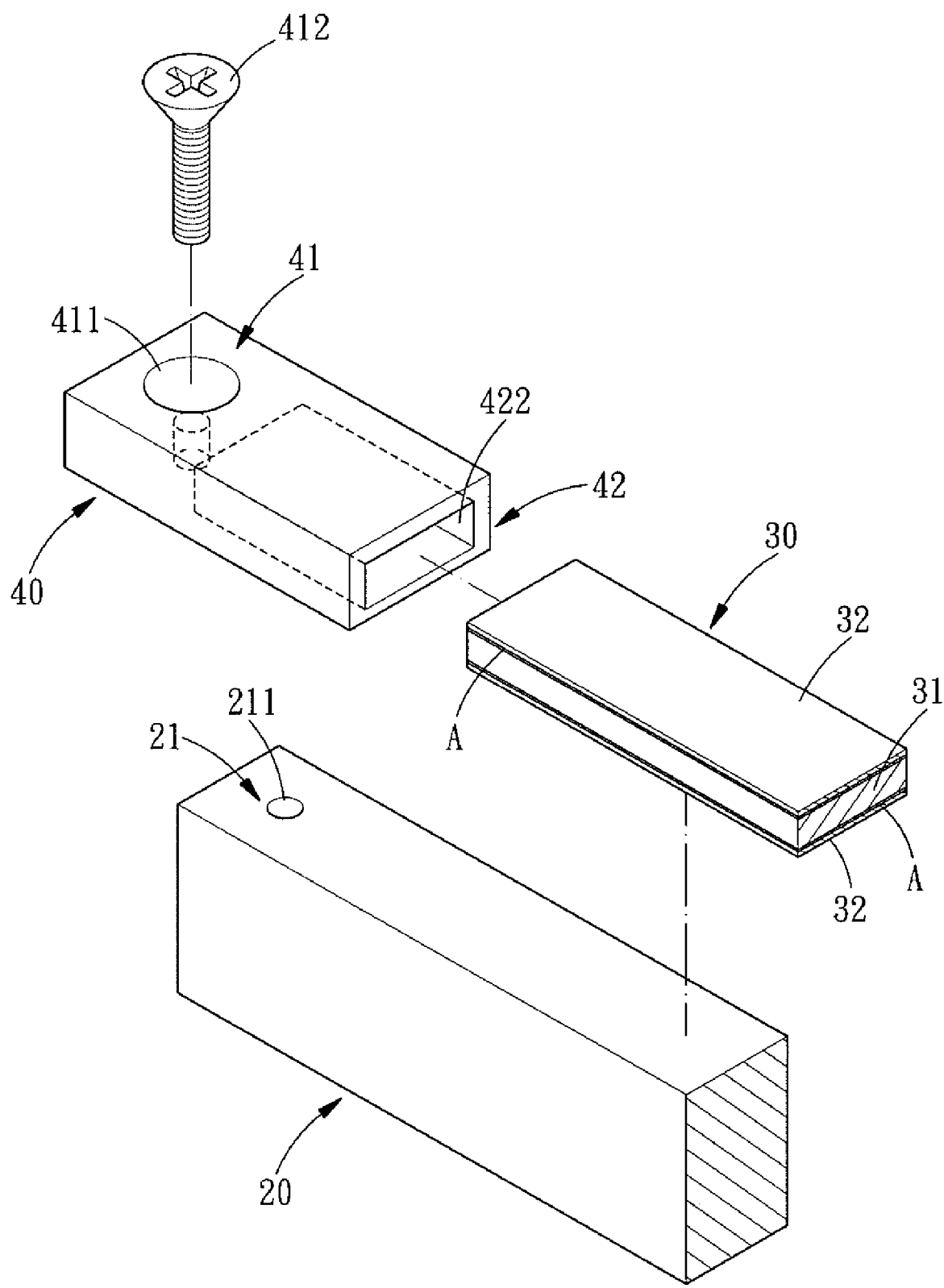
FIG. 4 is an exploded view of the positioning structure of a magnetic induction ruler in accordance with a second embodiment of the present invention.

Referring to FIGS. 2, 3 and 4, a positioning structure of a magnetic induction ruler in accordance with a first embodiment of the present invention comprises a base 20, an induction ruler 30 and a fixing assembly 40.

In one end of the base 20 is formed a first positioning portion 21 that is defined with a positioning hole 211.

The induction ruler 30 is rectangular sheet-shaped and includes a magnetic member 31 and two metal members 32. The metal members 32 are stuck to the opposite sides of the magnetic member 31 by double side adhesive A respectively, and the induction ruler 30 is stuck to a top end of a side of the base 20 via one of the metal members 32, such that one end of the induction ruler 30 is located a distance from the positioning hole 211 of the first positioning portion 21 of the base 20.

The fixing assembly 40 is rectangular block-shaped, and one end of the fixing assembly 40 is formed with a second positioning portion 41 that includes a through hole 411 and a positioning member 412. The positioning member 412 is an ordinary screw (as shown in FIG. 2) or a rivet (not shown), the through hole 411 is provided for insertion of the positioning member 412 in such a manner that the positioning member 412 is inserted in the through hole 411 and the positioning hole 211 of the first positioning portion 21 of the base 20 (the positioning member 412 can be a screw or a rivet as shown in FIG. 3).

The other end of the fixing assembly 40 is formed with a restriction portion 42, the restriction portion 42 is defined with an abutting groove 421, and the depth of the abutting groove 421 is the same as that of the induction ruler 30. When the positioning member 412 of the second positioning portion 41 of the fixing assembly 40 is locked in the positioning hole 211 of the first positioning portion 21 of the base 20 and the through hole 411, one end of the induction ruler 30 is fixed to the base 20 by the pressure of the abutting groove 421.

As can be clearly seen from the above-mentioned structure, only one end of the induction ruler 30 is fixed to the base 20 by one fixing assembly 40, and the other end of the induction ruler 30 is fixed to the base 20 by the same fixing structure (not shown).

FIG. 4 is an exploded view of a positioning structure of a magnetic induction ruler in accordance with a second embodiment of the present invention. In the end of the restriction portion 42 of the fixing assembly 40 is designed to form an insertion groove 422 for insertion of the end of the induction ruler 30, such that the positioning member 412 of the second positioning portion 41 is inserted in the positioning hole 211 of the first positioning portion 21, and the insertion groove 422 of the fixing assembly 40 enables the induction ruler 30 to be positioned on the base 20 without using adhesive.

For a better understanding of the present invention, its operations and functions, reference should be made to FIGS. 2-4:

The induction ruler 30 is firstly stuck to the base 20, then the positioning member 412 of the second positioning portion 41 of the fixing assembly 40 is inserted in the through hole 411 and the positioning hole 211 of the first positioning portion 21, enabling both ends of the induction ruler 30 to be fixed to the base 20 by the pressure of the restriction portion 42 of the fixing assembly 40.

However, the induction ruler 30 is stuck to the base 20 by double side adhesive A, and the double side adhesive A is susceptible to chips and greasy dirt, so that the adhesion force of the double side adhesive A is reduced. To solve such a problem, the positioning member 412 of the second positioning portion 41 of the fixing assembly 40 is inserted in the positioning hole 211 of the first positioning portion 21, enabling both ends of the induction ruler 30 to be fixed to the base 20 by the pressure of the restriction portion 42 of the fixing assembly 40. Thereby, the magnetic member 31 and the metal members 32 of the induction ruler 30 can be stuck to each other firmly, and even if the magnetic member 31 is departed from the metal members 32, the fixing assembly 40 still can maintain the magnetic induction of the induction ruler 30.

To summarize, a positioning structure of a magnetic induction ruler of the present invention comprises a base, an induction ruler and a fixing assembly. In one end of the base is formed a first positioning portion, one end of the fixing assembly is formed with a second positioning portion, and the other end of the fixing assembly is formed with a restriction portion. The positioning member of the second positioning portion of the fixing assembly is inserted in the positioning hole of the first positioning portion, enabling both ends of the induction ruler to be fixed to the base by the pressure of the restriction portion of the fixing assembly. Thereby, the magnetic member and the metal members of the induction ruler can be stuck to each other firmly.

While we have shown and described various embodiments in accordance with the present invention, it should be clear to those skilled in the art that further embodiments may be made without departing from the scope of the present invention.

What is claimed is:

1. A positioning structure of a magnetic induction ruler, comprising:
    a base formed with a first positioning portion in one end thereof;
    an induction ruler fixed to the base, one end of the induction ruler being adjacent to the first positioning portion of the base; and
    a fixing assembly, one end of the fixing assembly being formed with a second positioning portion located correspondingly to the first positioning portion of the base, and the other end of the fixing assembly being formed with a restriction portion located correspondingly to one end of the induction ruler, enabling one end of the induction ruler to be fixed to the base by the pressure of the restriction portion of the fixing assembly;
    in one end of the base is formed a first positioning portion that is defined with a positioning hole;
    the induction ruler is rectangular sheet-shaped and includes a magnetic member and two metal members, the metal members are stuck to opposite sides of the magnetic member respectively, the induction ruler is stuck to a top end of a side of the base via one of the metal members, such that one end of the induction ruler is located a distance from the positioning hole of the first positioning portion of the base; and
    the fixing assembly is rectangular block-shaped, one end of the fixing assembly is formed with a second positioning portion that includes a through hole and a positioning member, the through hole is provided for insertion of the positioning member in such a manner that the positioning member is inserted in the through hole and the positioning hole of the first positioning portion of the base, the other end of the fixing assembly is formed with a restriction portion, the restriction portion is defined with an abutting groove, and one end of the induction ruler is fixed to the base by the pressure of the abutting groove.

2. The positioning structure of a magnetic induction ruler as claimed in claim 1, wherein the positioning member of the second positioning portion of the fixing assembly is a screw.

3. The positioning structure of a magnetic induction ruler as claimed in claim 1, wherein the positioning member of the second positioning portion of the fixing assembly is a rivet.

4. The positioning structure of a magnetic induction ruler as claimed in claim 1, wherein:
    in one end of the base is formed a first positioning portion that is defined with a positioning hole;
    the induction ruler is rectangular sheet-shaped and includes a magnetic member and two metal members, the metal members are stuck to opposite sides of the magnetic member respectively, the induction ruler is stuck to a top end of a side of the base via one of the metal members, such that one end of the induction ruler is located a distance from the positioning hole of the first positioning portion of the base; and
    the fixing assembly is rectangular block-shaped, one end of the fixing assembly is formed with a second positioning portion that includes a through hole and a positioning member, the through hole is provided for insertion of the positioning member in such a manner that the positioning member is inserted in the through hole and the positioning hole of the first positioning portion of the base, the other end of the fixing assembly is formed with a restriction portion, and the restriction portion is defined with an insertion groove for insertion of the end of the induction ruler, such that the induction ruler is fixed to the base.

5. The positioning structure of a magnetic induction ruler as claimed in claim 4, wherein the positioning member of the second positioning portion of the fixing assembly is a screw.

6. The positioning structure of a magnetic induction ruler as claimed in claim 4, wherein the positioning member of the second positioning portion of the fixing assembly is a rivet.

* * * * *